United States Patent
Khang et al.

(10) Patent No.: US 11,942,352 B2
(45) Date of Patent: Mar. 26, 2024

(54) MANUFACTURING METHOD OF LED DISPLAY

(71) Applicant: INDUSTRY-ACADEMIC COOPERATION FOUNDATION, YONSEI UNIVERSITY, Seoul (KR)

(72) Inventors: Dahl Young Khang, Seoul (KR); Byong Joo Lee, Goyang-si (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 254 days.

(21) Appl. No.: 17/462,219

(22) Filed: Aug. 31, 2021

(65) Prior Publication Data

US 2022/0068693 A1    Mar. 3, 2022

(30) Foreign Application Priority Data

Aug. 31, 2020   (KR) .......................... 10-2020-0109942
Aug. 17, 2021   (KR) .......................... 10-2021-0108298

(51) Int. Cl.
*H01L 21/683* (2006.01)
*H01L 25/075* (2006.01)
*H01L 33/62* (2010.01)

(52) U.S. Cl.
CPC ...... *H01L 21/6835* (2013.01); *H01L 25/0753* (2013.01); *H01L 33/62* (2013.01); *H01L 2221/68354* (2013.01); *H01L 2221/68363* (2013.01); *H01L 2933/0066* (2013.01)

(58) Field of Classification Search
CPC . H01L 21/6835; H01L 25/0753; H01L 33/62; H01L 2221/68354; H01L 2221/68363; H01L 2933/0066; H01L 33/0095; H01L 2221/68336

USPC .......................................................... 438/28
See application file for complete search history.

(56) References Cited

U.S. PATENT DOCUMENTS

| | | | |
|---|---|---|---|
| 8,506,867 B2* | 8/2013 | Menard | H01L 24/75 264/293 |
| 9,954,139 B2* | 4/2018 | Krause | H01L 21/76251 |
| 10,050,026 B2* | 8/2018 | Takeya | H01L 33/504 |
| 10,573,543 B2* | 2/2020 | Hussell | H01L 21/67144 |
| 10,723,112 B2* | 7/2020 | Chua | H01L 21/2007 |
| 11,062,936 B1* | 7/2021 | Moore | H01L 21/68764 |
| 11,217,559 B2* | 1/2022 | Fan | H01L 22/26 |

(Continued)

FOREIGN PATENT DOCUMENTS

KR    1020190021223    3/2019

OTHER PUBLICATIONS

Yoon et al., "Heterogeneously integrated optoelectronic devices enabled by micro-transfer printing", *Adv. Optical Mater.* vol. 3, pp. 1313-1335, 2015.

(Continued)

*Primary Examiner* — Vu A Vu
(74) *Attorney, Agent, or Firm* — NORTON ROSE FULBRIGHT US LLP

(57) ABSTRACT

A manufacturing method of an LED display is disclosed. The method includes picking up a plurality of LED chips spaced apart at a first interval with a stretchable stamp, spacing apart the plurality of LED chips at a second interval by stretching the stretchable stamp, and transferring the plurality of LED chips to a target substrate.

12 Claims, 10 Drawing Sheets

(56) References Cited

U.S. PATENT DOCUMENTS

2008/0122119 A1* 5/2008 Kian .................. H01L 21/6835
                                                                438/118

OTHER PUBLICATIONS

Office Action issued in corresponding Korean Application No. 1020210108298, dated Apr. 5, 2023.

* cited by examiner

MANUFACTURING METHOD OF LED DISPLAY

CROSS-REFERENCE TO RELATED APPLICATION

This application claims priority to and the benefit of Korean Patent Applications No. 10-2020-0109942, filed on Aug. 31, 2020, and No. 10-2021-0108298, filed on Aug. 17, 2021, the disclosures of which are each incorporated herein by reference in their entireties.

BACKGROUND

Field of the Disclosure

The present technology relates to a method for manufacturing an LED display.

Description of Related Art

The micro-LED display is a device for displaying the target correct images and moving images by arranging small LEDs. The micro-LED display is attracting attention as a next generation display following the current organic light-emitting device (OLED) and quantum light-emitting device (QLED).

The micro-LED display is formed by transferring light-emitting elements onto a display substrate on each wafer in which R light-emitting elements, G light-emitting elements and B light-emitting elements are formed with high density. In the display substrate onto which the light-emitting elements are transferred, light-emitting elements of one color are disposed to be adjacent to light emitting elements of another color and the like, and disposed on the display substrate at an interval different from an interval disposed in the wafer to form a display.

Conventionally, an LED display was formed by repeating a process of transferring light-emitting elements one by one to the desired position of a display substrate on a wafer on which the light emitting elements were formed. This repetition of the transfer process reduces mass productivity and increases the process cost to consequently increase the production cost of products.

One of the problems to be solved by the present technology is to solve the above-mentioned problems of the prior art. That is, one of the problems to be solved by the present exemplary embodiment is to provide a method for manufacturing a micro-LED display capable of improving mass productivity of micro-LED displays and reducing the process cost.

SUMMARY

The method for manufacturing an LED display according to the present exemplary embodiment includes picking up a plurality of LED chips spaced apart at a first interval with a stretchable stamp, spacing apart the plurality of LED chips at a second interval by stretching the stretchable stamp, and transferring the plurality of LED chips to a target substrate.

According to an aspect of the present exemplary embodiment, the stretchable stamp may be an elastomer.

According to an aspect of the present exemplary embodiment, the elastomer may have a Young's modulus of 10 Pa to 10 MPa.

According to an aspect of the present exemplary embodiment, the elastomer may be any one of PDMS, Ecoflex and a hydrogel.

According to an aspect of the present exemplary embodiment, the second interval may be 1.1 times to 10 times the first interval.

According to an aspect of the present exemplary embodiment, spacing apart at the second interval may be performed by stretching the stretchable stamp in two or more directions different from each other.

According to an aspect of the present exemplary embodiment, spacing apart at the second interval may be performed by stretching the stretchable stamp in any one direction.

In addition, the present invention provides a stretchable stamp for transferring an LED chip, including a body; and a plurality of pick-up pillars arranged in a predetermined pattern on one surface of the body to transfer the LED chip, wherein the body comprises an elastomer that can be stretched in more than one (uniaxial) direction.

According to an aspect of the present exemplary embodiment, the elastomer may have a Young's modulus of 10 Pa to 10 MPa.

According to an aspect of the present exemplary embodiment, the pick-up pillar may include a cylinder portion connected to the body and a top portion having a larger cross-sectional area than the cylinder portion on the upper surface of the cylinder portion and contacting an LED chip when the LED chip is transferred, wherein the height ratio of the cylinder portion and the top portion is 2:3 to 2:1.

In addition, according to an aspect of the present exemplary embodiment, the cross-sectional area ratio of the cylinder portion and the top portion may be 100:130 to 100:300.

According to an aspect of the present exemplary embodiment, the pick-up pillar may include an elastomer having a Young's modulus of 10 Pa to 10 MPa.

According to an aspect of the present exemplary embodiment, the body may have an elongation ratio of 10% to 1,000%.

The method for manufacturing an LED display according to the present exemplary embodiment provides the advantages of improving the degree of freedom of the arrangement, diversity and mass productivity of the LED display, and reducing the process cost.

DETAILED DESCRIPTION OF THE INVENTION

Figure 1:
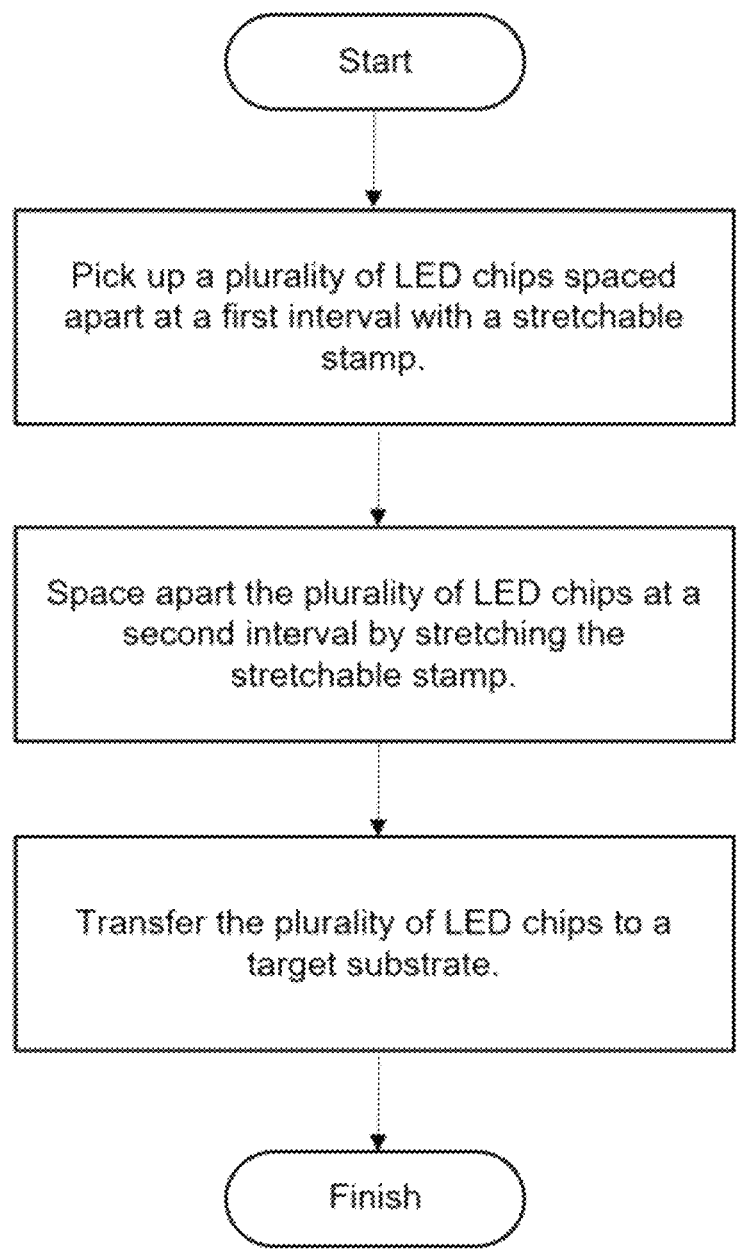
FIG. 1 is a flowchart illustrating the outline of a method for manufacturing an LED display according to the present exemplary embodiment.

Hereinafter, the method for manufacturing an LED display according to the present exemplary embodiment will be described with reference to the accompanying drawings. FIG. 1 is a flowchart illustrating the outline of a method for manufacturing an LED display according to the present exemplary embodiment. Referring to FIG. 1, the method for manufacturing an LED display includes the steps of picking up a plurality of LED chips spaced apart at a first interval with a stretchable stamp S100, spacing apart the plurality of LED chips at a second interval by stretching the stretchable stamp S200, and transferring the plurality of LED chips to a target substrate S300.

Figure 2:
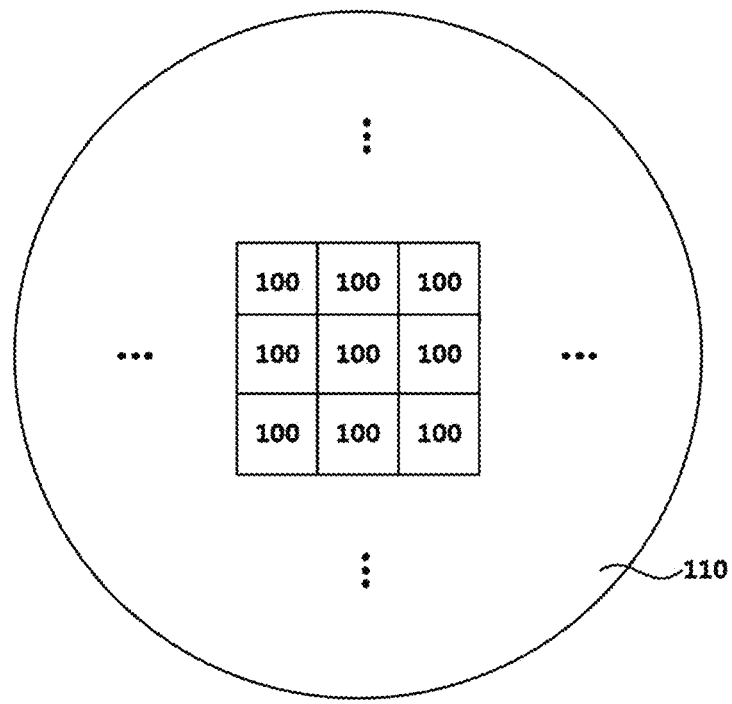
FIG. 2 is a plan view schematically illustrating a wafer on which LED chips are formed.
Figure 3:
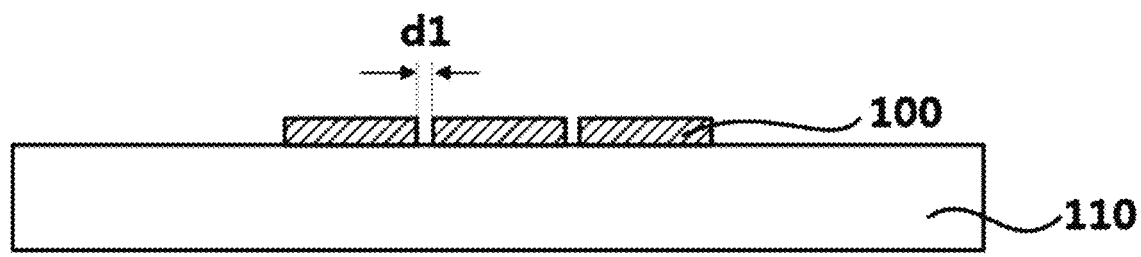
FIG. 3 is a cross-sectional view schematically illustrating a wafer on which LED chips are formed.

FIG. 2 is a plan view schematically illustrating a wafer 110 on which LED chips 100 are formed, and FIG. 3 is a cross-sectional view schematically illustrating a wafer 110 on which LED chips 100 are formed. Referring to FIGS. 2 and 3, a wafer 110 is formed with LED chips 100 that provide light at a predetermined wavelength to a grown epitaxial layer. In one exemplary embodiment, the wafer 110 may be individualized by dicing along the boundaries of the LED chips 100 such that each LED chip may be transferred. The LED chips 100 formed on the wafer 110 may each be spaced apart at a first interval.

In one exemplary embodiment, the wafer 110 may be a wafer in which an aluminum gallium arsenide (AlGaAs) epitaxial layer is grown on a gallium arsenide (GaAs) substrate, which may be diced to form an LED chip 100 that provides a wavelength in the red region.

In another exemplary embodiment, the wafer may be a wafer having an indium gallium nitride (InGaN) epitaxial layer or a gallium nitride (GaN) epitaxial layer grown on a sapphire substrate, which may be diced to form an LED chip 100 that provides light at wavelengths in the green region or in the blue region. In one example, the chips 100 may be micro-LED chips having a width and/or length dimension of 100 μm or less.

Figure 4:
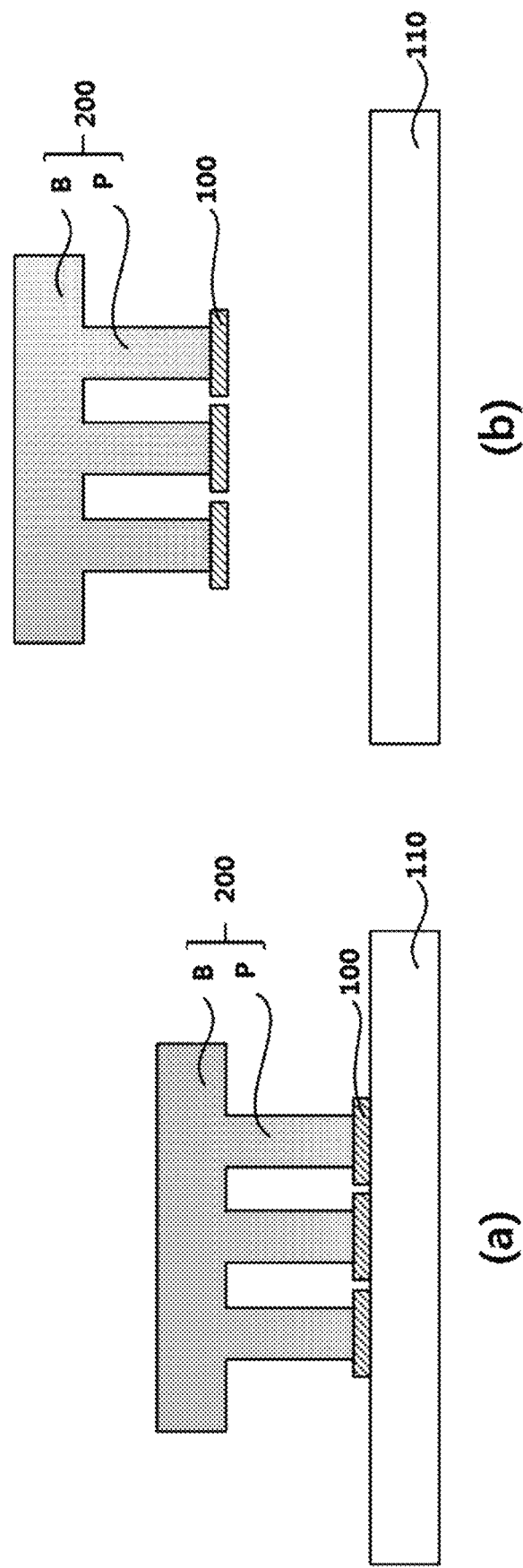
FIG. 4(a) is a diagram illustrating the process of aligning a stretchable stamp and LED chips.
FIG. 4(b) is a diagram illustrating the step of picking up LED chips with a stretchable stamp.

FIG. 4(*a*) is a diagram illustrating the process of aligning a stretchable stamp 200 and LED chips 100, and FIG. 4(*b*) is a diagram illustrating the step of picking up LED chips 100 with a stretchable stamp 200. Referring to FIG. 4A, the stretchable stamp 200 and the LED chips 100 are aligned.

In one exemplary embodiment, the stretchable stamp 200 may include a body B and a pick-up pillar P. The pick-up pillar P and the body B of the stretchable stamp may be formed of an elastomer. In one example, the body B and the pick-up pillar P may be formed of the same elastomer. In another example, the body B and the pick-up pillar P may be formed of different elastomers. In one example, the elastomer that makes up the stretchable stamp 200 may be any one of PDMS, PMMA, Ecoflex and a hydrogel.

Preferably, the elastomer may have a Young's modulus of 10 Pa to 10 MPa. If the Young's modulus is less than 10 Pa, the yield strength is lowered such that the restoring force of the stretchable stamp is lowered and the long-term durability may be lowered. In addition, if the Young's modulus is more than 10 MPa, an error in the degree of elongation may occur partially.

In one exemplary embodiment, the stretchable stamp 200 may be aligned by an actuator (not illustrated) that controls the position of the stretchable stamp 200. The stretchable stamp 200 may be aligned such that the pick-up pillars P are located on top of the LED chips 100.

Referring to FIG. 4(*b*), the stretchable stamp 200 is lowered such that the surface of the pick-up pillar P adheres to the surface of the LED chip 100. Subsequently, as the stretchable stamp 200 is raised, the LED chips 100 are attached to the surface of the pick-up pillar P and raised with the stretchable stamp 200 S100.

The LED chip 100 is attached to the pick-up pillar P by a Van der Waals force. The pick-up pillar P is made of an elastomer, and the surface of the pick-up pillar P to which the LED chip 100 is attached is flat and soft such that conformal contact between the LED chips 100 and the pick-on pillar P occurs, and thus the attachment force is maximized.

The pick-up pillar may preferably be made of an elastomer having a Young's modulus of 10 Pa to 10 MPa. When the Young's modulus is less than 10 Pa, there is a problem that the adhesion force to the LED chip is reduced because the pick-up pillar is excessively deformed at the time of stretching the stretchable stamp, and when it is more than 10 MPa, there is a concern that the long-term durability of the entire stretchable stamp may be reduced.

The pick-up pillar preferably includes a cylinder portion connected to the body and a top portion having a larger cross-sectional area than the cylinder portion on the upper surface of the cylinder portion and contacting an LED chip when the LED chip is transferred, and the cylinder portion and the top portion may have a height ratio of 2:3 to 2:1.

By having such a configuration, the stretchable stamp according to the present invention may have a T-shaped cross section of the pick-up pillar in a direction perpendicular to the body plane, and the cross sections of the cylinder portion and the top portion may preferably be circular. In this case, the cylinder portion and the top portion may each have a columnar shape.

In the case of the T-shape as described above, the deformation rate of the upper surface of the top portion is reduced due to the stretching of the body part, and thus, a decrease in the adhesion force to the LED chip may be small.

The cross sections of the cylinder portion and the top portion are not necessarily limited to a circular shape, and may have various shapes such as a rectangular shape, an elliptical shape and the like.

Preferably, the cross-sectional area ratio of the cylinder portion and the top portion may be 100:130 to 100:300. If the cross-sectional area of the top portion is less than 130% of the cross section of the cylinder portion, the strain on the upper surface of the top portion may be increased upon stretching of the stretchable stamp body, resulting in a decrease of the adhesion force to the LED chip, substantially similar to that consisting of only a cylinder portion without a top portion. On the other hand, when the cross-sectional area of the top portion is more than three times that of the cylinder portion, the durability of the pick-up pillar may be structurally weakened, which may reduce the long-term durability of the entire stretchable stamp.

Figure 5:
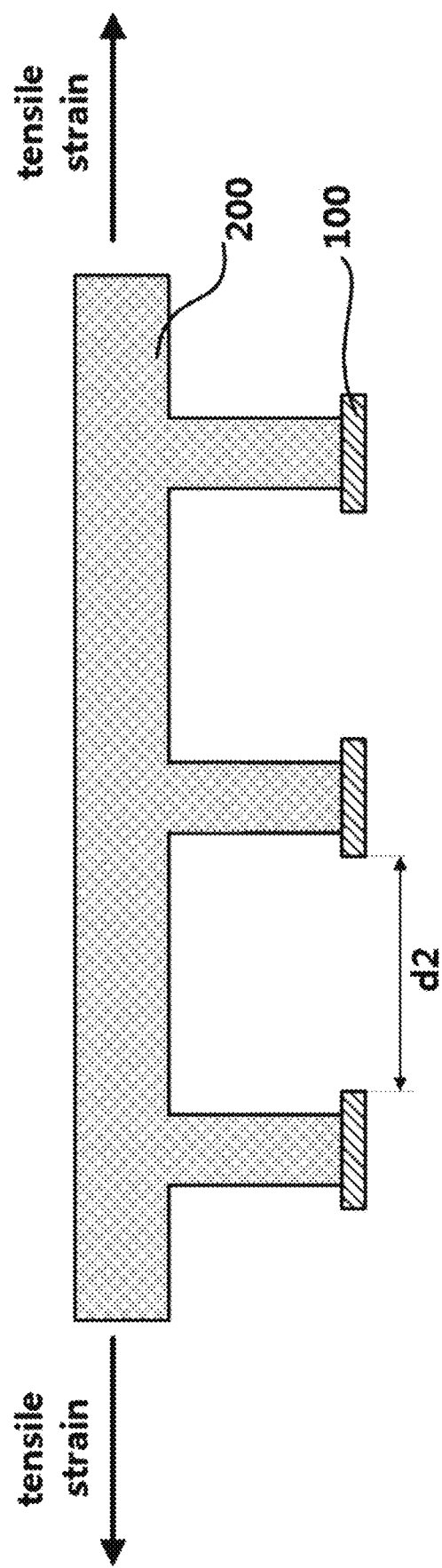
FIG. 5 is a diagram schematically illustrating a state in which the stretchable stamp is stretched.

FIG. 5 is a diagram schematically illustrating a state in which the stretchable stamp is stretched. Referring to FIG. 5, a tensile force is provided to stretch the stretchable stamp 200.

The stretchable stamp 200 is stretched such that the LED chips 100 attached to the pick-up pillar P are spaced apart at a second interval d2 that is greater than a first interval d1. In one example, the second interval d2 may correspond to the spacing distance of a target location at which the LED chips are disposed in a target substrate 300. In one exemplary embodiment, the stretchable stamp 200 may be stretched by providing a tensile force in two different directions (x and y directions). In another exemplary embodiment, the stretchable stamp 200 may be stretched by providing a tensile force in either direction.

Preferably, the second interval may be 1.1 to 10 times the first interval. By stretching the LED chip by 1.1 times or more, the number of transfers may be reduced when transferring LED chips. However, when stretching by more than 10 times, deformation may occur in the stretchable stamp, resulting in poor transfer accuracy, and there is a concern that the long-term durability of the stretchable stamp may be reduced.

In addition, preferably, the stretchable stamp according to the present invention may have an elongation ratio of the body of 10% to 1,000%.

As used herein, the term "elongation ratio" is the ratio of the stretched length (Ala) to the original length until the member is stretched and broken.

If the elongation ratio is less than 10%, the yield strength is lowered such that permanent deformation may occur in the stretchable stamp, and if it is more than 1,000%, there is a problem that the Young's modulus becomes excessively high.

Figure 6:
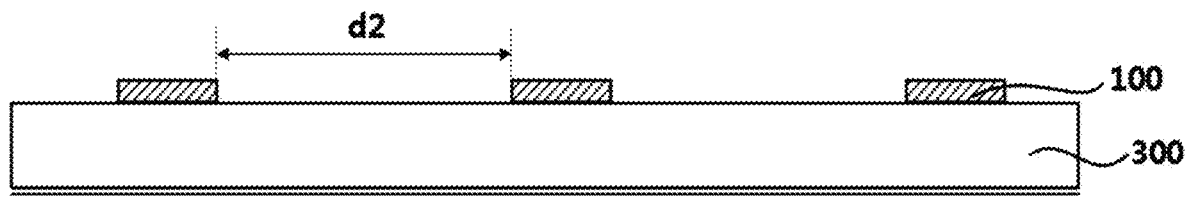
FIG. 6 is a diagram illustrating the step of transferring LED chips to a target substrate with a stretchable stamp in a stretched state.

FIG. 6 is a diagram illustrating a state in which the LED chips 100 are transferred to a target substrate 400 in a state in which the stretchable stamp 200 is stretched. Referring to FIG. 6, an actuator (not illustrated) aligns the position of the stretchable stamp 200 with the target substrate 300 in a stretched state. Subsequently, the stretchable stamp 200 may be lowered to dispose the LED chips 100 at a target location formed in the target substrate 100.

The target location may be formed with one or more pads (not illustrated) that are coupled to a line that provides electrical signals and electrically coupled to the LED chip to transfer electrical signals. In addition, an adhesive layer (not illustrated) may be formed at each target location such that the LED chips 100 attached to the pick-up pillar P are attached on the substrate. Thus, after the stretchable stamp 200 is aligned to a location at which the LED chips are disposed at a target location, the LED chips 100 may be secured at the target location as the stretchable stamp 200 provides a compressive force against the target substrate 300.

Figure 7:
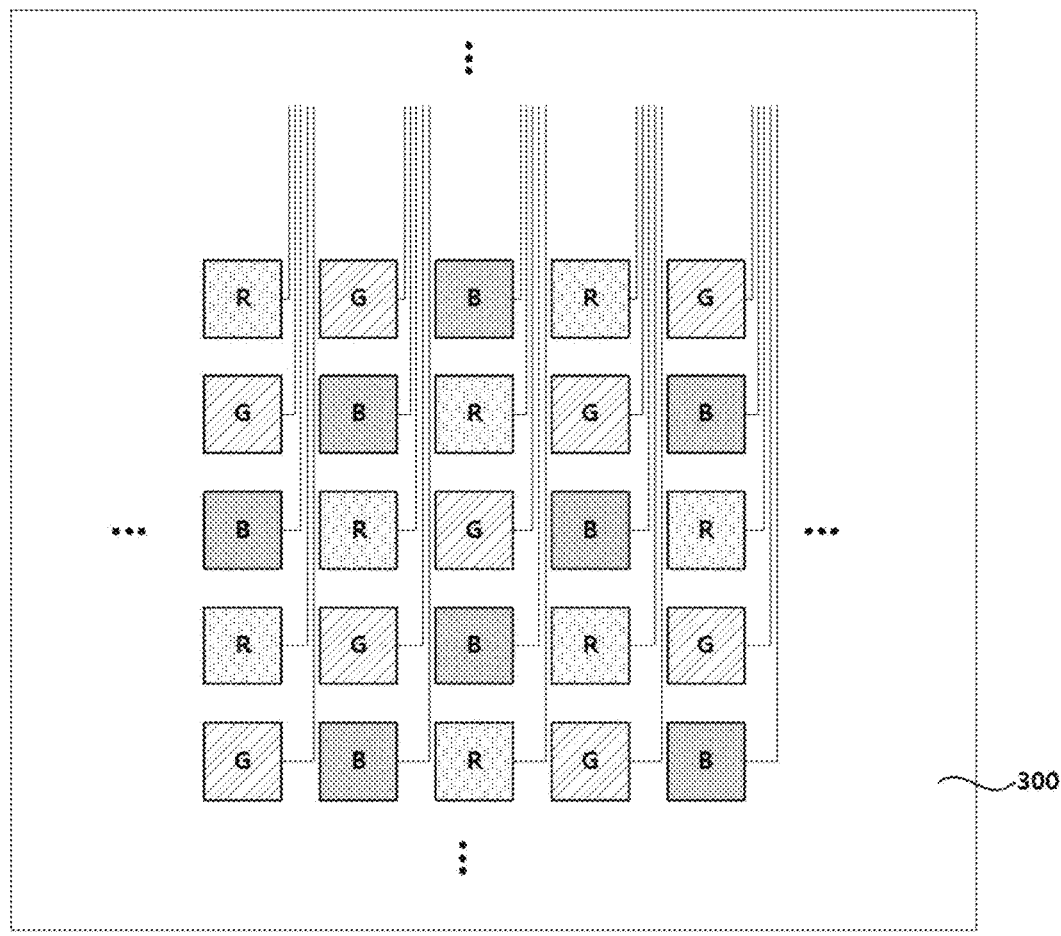
FIG. 7 is a diagram illustrating an example in which LED chips providing light of different colors are disposed on a target substrate.

FIG. 7 is a diagram illustrating an example in which light-emitting elements providing light of different colors are disposed on a target substrate 300. Referring to FIG. 7, in the target substrate 300, LED chips may be disposed adjacent to LED chips that provide light of different colors.

Experimental Results

Figure 8:
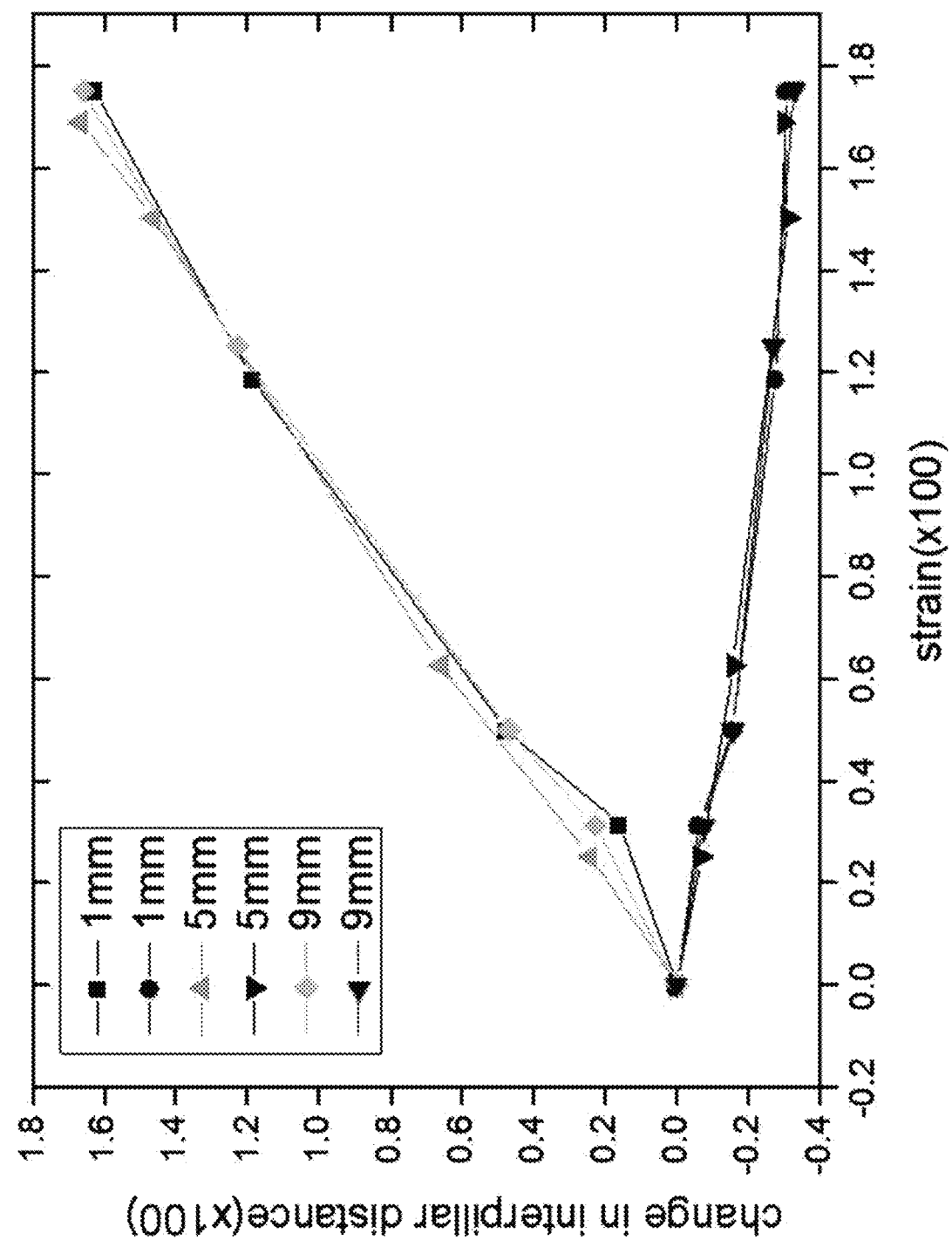
FIG. 8 is a graph measuring the applied tensile forces and changes in distance between attached LED chips 100 when the stretchable stamp is stretched along a single axis.

Hereinafter, experimental results of the present exemplary embodiment will be described with reference to FIG. 8 to FIG. 11. FIG. 8 is a graph measuring the applied tensile forces and changes in distance between attached LED chips 100 when the stretchable stamp is stretched along a single axis. Referring to FIG. 8, it can be confirmed that as the stretching force increases, the distance between the chips increases linearly along the direction in which the stretching force is provided. However, it can be confirmed that the spacing between the LED chips 100 is somewhat reduced in a direction orthogonal to the direction in which the stretching force is provided.

Figure 9:
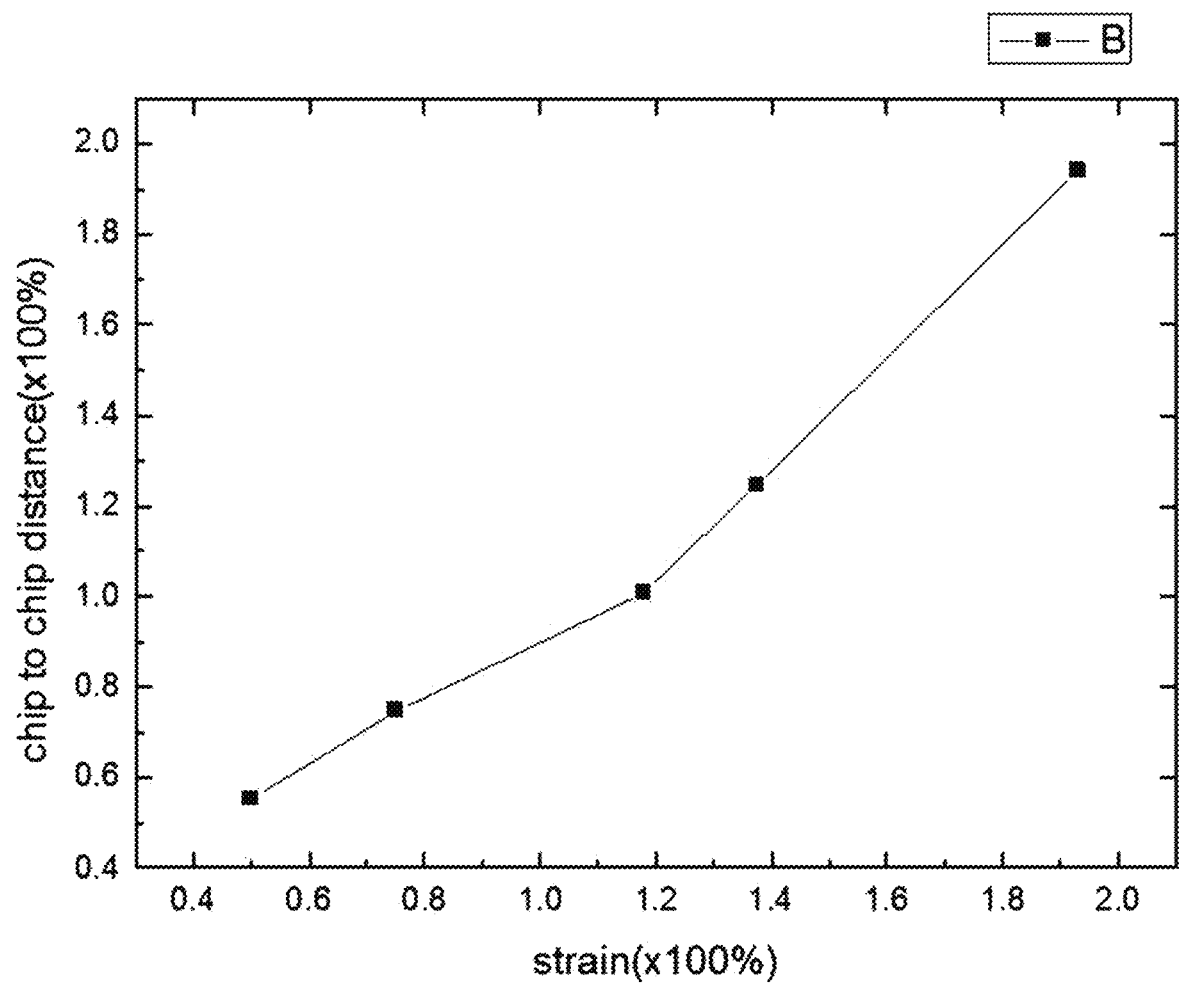
FIG. 9 is a graph measuring the applied tensile forces and changes in distance between attached LED chips, when the stretchable stamp is stretched along two axes that are orthogonal to each other.

FIG. 9 is a graph measuring the applied tensile forces and changes in distance between attached LED chips, when the stretchable stamp is stretched along two axes that are orthogonal to each other.

Referring to FIG. 9, it can be confirmed that the distance between the LED chips is formed linearly with the magnitude of the stretching force provided similarly to the above experimental results.

Figure 10:
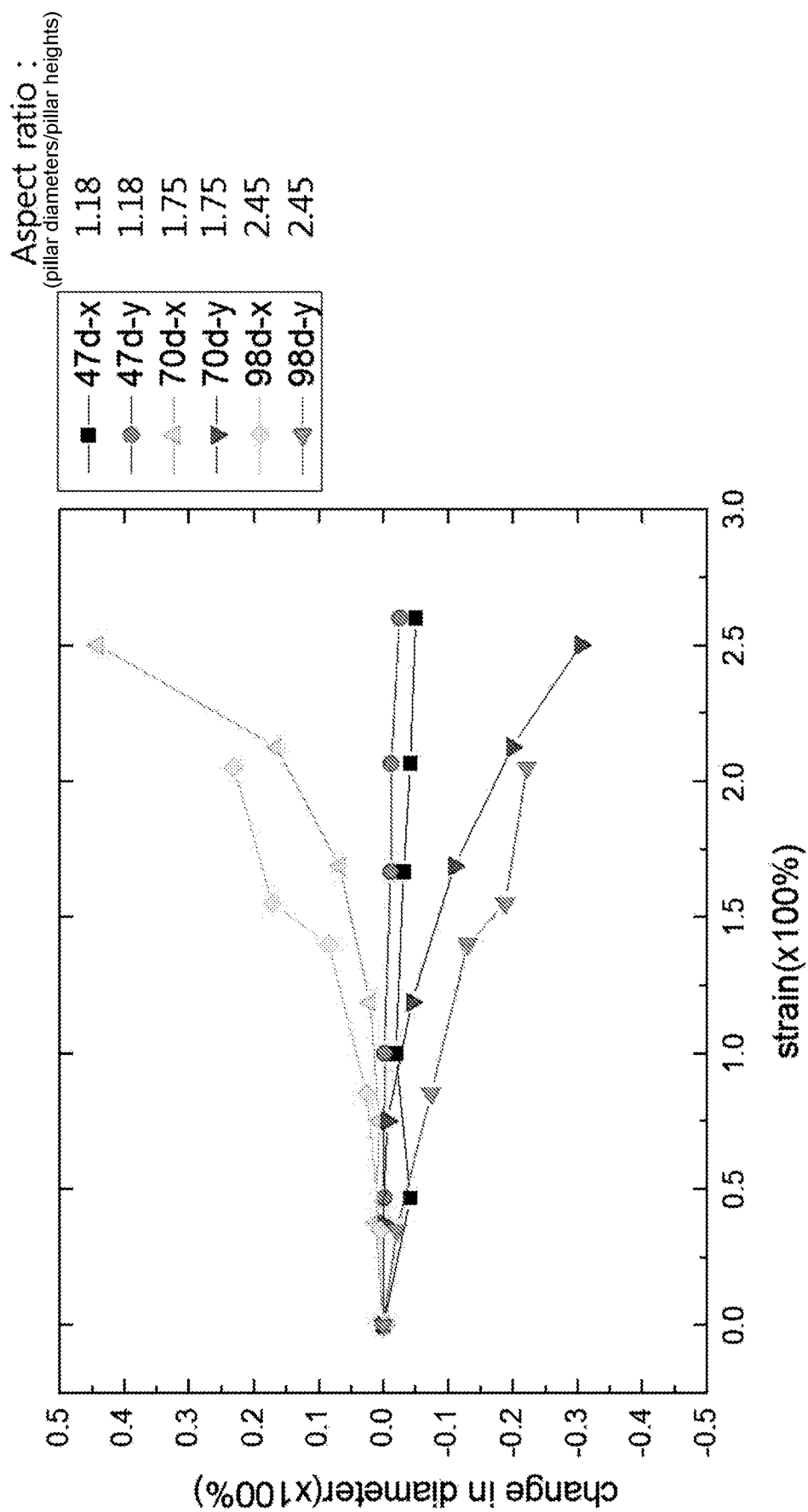
FIG. 10 is a diagram illustrating the cross-sectional shape of a pillar when a stretching force is applied in a single direction to pick-up pillars having a single height and different diameters.
Figure 11:
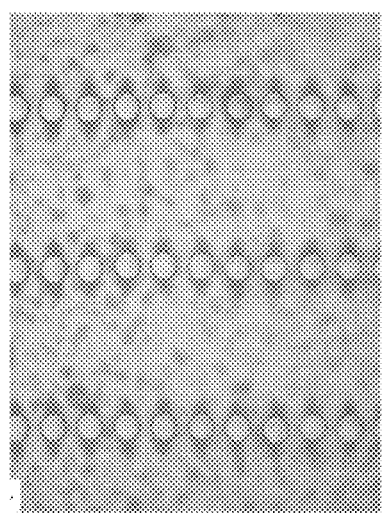
FIG. 11(*a-c*) are microscopic images of the cross sections of pick-up pillars when stretchable stamps having aspect ratios of 1.18, 1.75 and 2.45 are subjected to the same tensile force, respectively.
Figure 11:
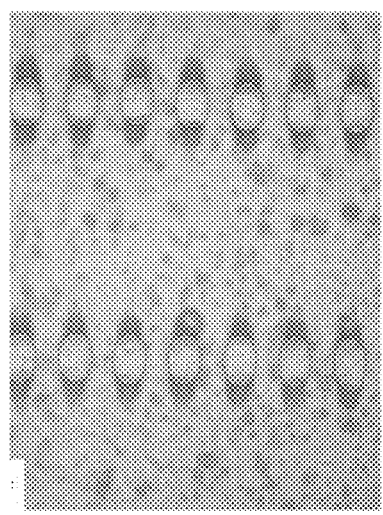
Figure 11:
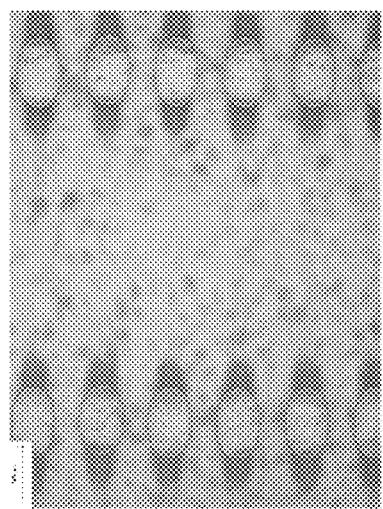

FIG. 10 is a diagram illustrating a change in the cross-sectional shape of a pillar when a stretching force is applied in a single direction (x direction) to pick-up pillars having a single height and different diameters. Referring to FIG. 10, it can be seen that as the stretching force provided in the x-direction gradually increases, the smaller the aspect ratio obtained by dividing the diameter of the pick-up pillar by the height of the pickup pillar, the less the change in the cross-sectional diameter of the pillar, and as the aspect ratios increase from 1.18, 1.75 to 2.45, the cross section of the pick-up pillar deforms from a circle to an ellipse.

These facts can also be confirmed from the microscopic images illustrated in FIGS. 11(a), 11(b) and 11(c). FIGS. 11(a) to 11(c) are microscopic images of the cross sections of pick-up pillars when stretchable stamps having aspect ratios of 1.18, 1.75 and 2.45 are subjected to the same tensile force, respectively. Referring to FIGS. 11(a) to 11(c), it can be confirmed that as the aspect ratio of the pick-up pillar increases, the change in the cross-sectional shape of the picking-up pillar is greater.

Figure 12:
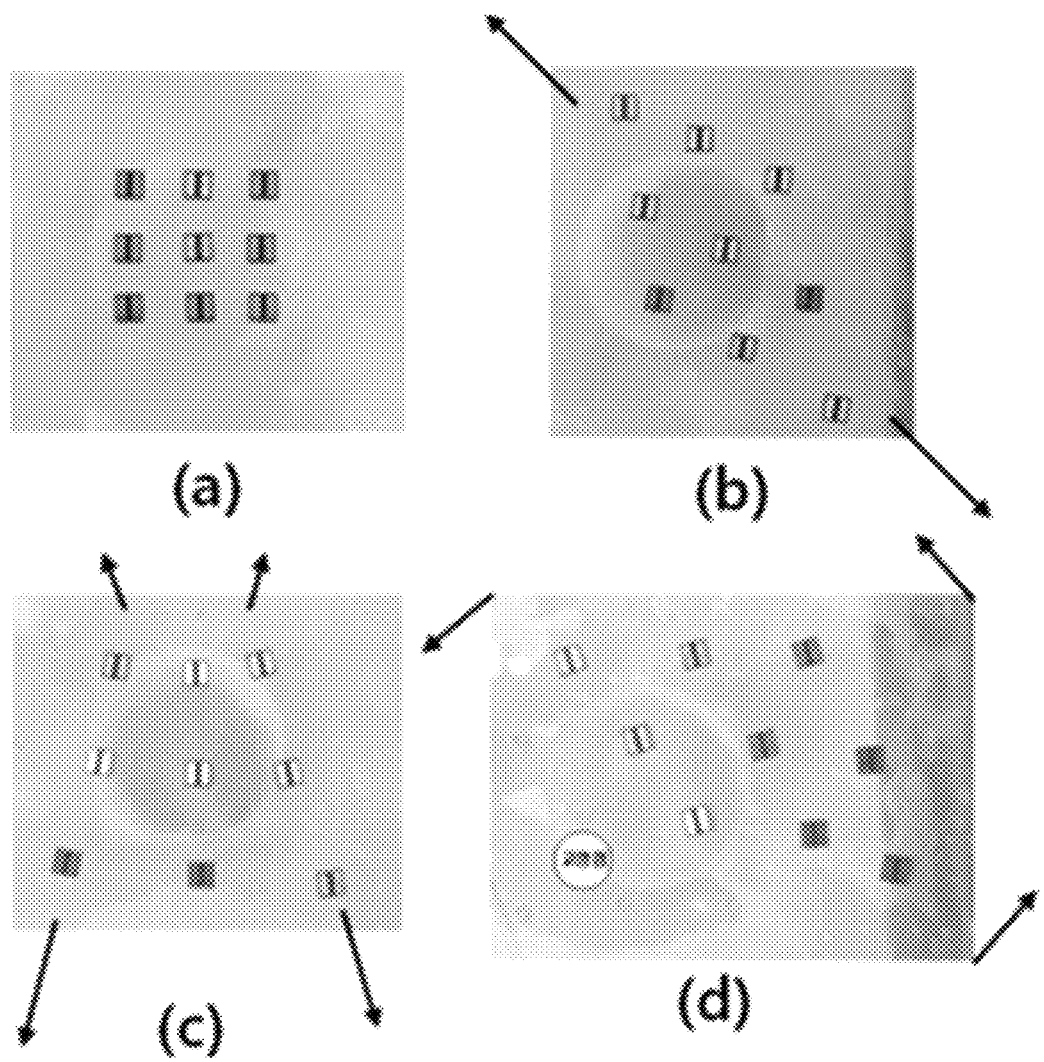
FIG. 12(*a-d*) are diagrams illustrating examples of directions in which the stretchable stamp is stretched

FIGS. 12(a) to 12(d) are diagrams illustrating examples of directions in which the stretchable stamp is stretched. FIG. 12(a) shows a state in which the stretchable stamp is not provided with a stretching force.

When the stretchable stamp is provided with a stretching force in the upper left and lower right directions, respectively, as shown in FIG. 12(b), the stretchable stamp is stretched in a diagonal direction, and the light-emitting elements arranged in a diagonal direction may be positioned by using the same.

As illustrated in FIG. 12(c), it is possible to provide a stretching force at the lower left and lower right, fix the upper left and upper right, or to provide a small stretching force.

Thus, it can be seen that the stretchable stamp is further stretched to the lower left and lower right provided with a large stretching force. In addition, as illustrated in FIG. 12(d), the light-emitting elements may be disposed in such a manner that one of the points of the stretchable stamp is fixed, and a stretching force is applied in a circumferential direction based on the fixed point to rotate in the circumferential direction.

Conventionally, each LED chip was transferred one by one to the target position of a target substrate to form an LED display. This transfer process has become a factor in increasing the cost of manufacturing LED displays. However, according to the present exemplary embodiment, it is possible to arrange a plurality of LED chips at a target position with a stretchable stamp, thereby reducing the time consumed in the process and thus providing an advantage that the manufacturing cost may be reduced therefrom.

Although the present invention has been described with reference to the exemplary embodiments illustrated in the drawings in order to help the understanding of the invention, these are only exemplary as exemplary embodiments for implementation, and those of ordinary skill in the art will understand that various modifications and other equivalent exemplary embodiments are possible therefrom. Accordingly, the true technical protection scope of the present invention should be defined by the appended claims.

EXPLANATION OF REFERENCE NUMERALS

S100 to S300: Each step of the method for manufacturing an LED display according to the present exemplary embodiment
100: LED chip
110: Wafer
200: Stretchable stamp
300: Target substrate
d1: First interval
d2: Second interval
B: Body
P: Pick-up pillar

The invention claimed is:

1. A method for manufacturing an LED display, comprising:
    picking up a plurality of LED chips spaced apart at a first interval with a stretchable stamp;
    spacing apart the plurality of LED chips at a second interval by stretching the stretchable stamp; and
    transferring the plurality of LED chips to a target substrate,
    using a plurality of pick-up pillars comprising a cylinder portion connected to the body and a top portion having a larger cross-sectional area than the cylinder portion on the upper surface of the cylinder portion,
    wherein the cross-sectional area ratio of the cylinder portion and the top portion is 100:130 to 100:300, and
    wherein the cylinder portion and the top portion each have a columnar shape.

2. The method of claim 1, wherein the stretchable stamp is an elastomer.

3. The method of claim 2, wherein the elastomer has a Young's modulus of 10 Pa to 10 MPa.

4. The method of claim 2, wherein the elastomer is any one of PDMS, Ecoflex and a hydrogel.

5. The method of claim 1, wherein the second interval is 1.1 times to 10 times the first interval.

6. The method of claim 1, wherein spacing apart at the second interval is performed by stretching the stretchable stamp in two or more directions different from each other.

7. The method of claim 1, wherein spacing apart at the second interval is performed by stretching the stretchable stamp in any one direction.

8. A stretchable stamp for transferring an LED chip, comprising:
    a body; and
    a plurality of pick-up pillars arranged in a predetermined pattern on one surface of the body to transfer the LED chip,
    wherein the body comprises an elastomer that can be stretched in more than one (uniaxial) direction,
    wherein the plurality pick-up pillars comprises a cylinder portion connected to the body and a top portion having a larger cross-sectional area than the cylinder portion on the upper surface of the cylinder portion and contacting an LED chip when the LED chip is transferred,
    wherein the cross-sectional area ratio of the cylinder portion and the top portion is 100:130 to 100:300, and
    wherein the cylinder portion and the top portion each have a columnar shape.

9. The stretchable stamp of claim 8, wherein the elastomer has a Young's modulus of 10 Pa to 10 MPa.

10. The stretchable stamp of claim 8, wherein the plurality of pick-up pillars comprises a cylinder portion connected to the body and a top portion having a larger cross-sectional area than the cylinder portion on the upper surface of the cylinder portion and contacting an LED chip when the LED chip is transferred,
    wherein the height ratio of the cylinder portion and the top portion is 2:3 to 2:1.

11. The stretchable stamp of claim 8, wherein the plurality pick-up pillars comprises an elastomer having a Young's modulus of 10 Pa to 10 MPa.

12. The stretchable stamp of claim 8, wherein the body has an elongation ratio of 10% to 1,000%.

* * * * *